United States Patent
Zhao et al.

(10) Patent No.: US 8,378,864 B2
(45) Date of Patent: Feb. 19, 2013

(54) APPARATUSES AND METHODS FOR REDUCING ERRORS IN ANALOG TO DIGITAL CONVERTERS

(75) Inventors: Lijie Zhao, Shanghai (CN); Song Gao, Tempe, AZ (US); Quinghua Hubert Yue, Shanghai (CN); Jeffrey G. Barrow, Tuscon, AZ (US)

(73) Assignee: Integrated Device Technology, Inc., San Jose, CA (US)

( * ) Notice: Subject to any disclaimer, the term of this patent is extended or adjusted under 35 U.S.C. 154(b) by 155 days.

(21) Appl. No.: 13/049,728

(22) Filed: Mar. 16, 2011

(65) Prior Publication Data
US 2012/0235846 A1    Sep. 20, 2012

(51) Int. Cl.
*H03M 1/06*    (2006.01)

(52) U.S. Cl. ........ 341/118; 341/163; 341/155; 341/172; 341/158

(58) Field of Classification Search .......... 341/155, 341/158, 163, 172, 117, 118, 119, 120
See application file for complete search history.

(56) References Cited

U.S. PATENT DOCUMENTS

| | | | |
|---|---|---|---|
| 5,006,853 A | 4/1991 | Kiriaki et al. | |
| 5,235,333 A | 8/1993 | Naylor et al. | |
| 5,675,340 A | 10/1997 | Hester et al. | |
| 6,940,445 B2 * | 9/2005 | Kearney | 341/163 |
| 7,432,844 B2 | 10/2008 | Mueck et al. | |
| 7,796,077 B2 | 9/2010 | Mitikiri et al. | |
| 2009/0027251 A1 * | 1/2009 | Ohnhauser et al. | 341/158 |
| 2010/0060500 A1 * | 3/2010 | Schatzberger et al. | 341/155 |

OTHER PUBLICATIONS

Tewbury et al., "The effects of oxide traps on the Large-signal transient response of analog MOS circuits" IEEE JSSC, vol. 24, pp. 542-544 Apr. 1989.
Tewbury et al., "Characterization, Modeling, and Minimization of Transient Threshold Voltage Shifts in MOSFET's" IEEE JSSC, vol. 29, pp. 239-252, Mar. 1994.

* cited by examiner

*Primary Examiner* — Jean B Jeanglaude
(74) *Attorney, Agent, or Firm* — TraskBritt P.C.

(57) ABSTRACT

Successive approximation Analog-to-digital converters (ADCs) and related methods are disclosed. A successive approximation ADC includes a comparator with a comparator output and inputs coupled to a common model signal and a compare input. Control logic generates one or more control signals responsive to the comparator output. A capacitor array includes first sides of capacitors operably coupled to an array output. The capacitor arrays selectively couples each of second sides of the capacitors to an analog input signal and one or more input reference signals responsive to the one or more control signals. A voltage limiter is operably coupled between the array output and the compare input of the comparator and limits a voltage on the compare input to within a predefined range relative to the array output. The successive approximation ADC may also be configured differentially with a second comparator and a second voltage limiter.

22 Claims, 6 Drawing Sheets

APPARATUSES AND METHODS FOR REDUCING ERRORS IN ANALOG TO DIGITAL CONVERTERS

TECHNICAL FIELD

Embodiments of the present disclosure relate generally to analog-to-digital converters (ADCs) and, more particularly, to apparatuses and methods related to reducing errors in successive approximation ADCs.

BACKGROUND

Selectable capacitor banks and charge redistribution using Successive Approximation Registers (SAR) are often used to perform analog-to-digital conversion. These successive approximation ADCs provide good resolution, an ability to asynchronously sample an input signal, and a relatively small amount of circuitry when compared to other ADC techniques. However, successive approximation ADCs may be susceptible to errors due to a broad range of voltages that can be applied to inputs of the comparison circuitry. The comparison circuitry must be capable of accurately comparing very small differences between input signals and at the same time, accurately compare input signals with relatively high voltage differences.

One source of errors in successive approximation ADCs is a time-dependent and voltage-dependent threshold shift in Metal Oxide Semiconductor (MOS) transistors used in the comparison circuitry. This threshold shift is often referred to as a hysteresis effect. The relatively high voltages that may be placed on inputs of the comparison circuitry during early stages of a SAR process can cause large overdrive of comparator inputs, which may result in a significant threshold shift effect that can cause errors in the ADC.

One proposal for addressing the threshold shift effect is disclosed in U.S. Pat. No. 5,675,340 to Hester et al., which includes a coarse ADC added to a traditional SAR ADC to reduce the voltages imposed on a comparator in the traditional SAR ADC.

Another proposal for addressing the threshold shift effect is disclosed in U.S. Pat. No. 5,006,853 to Kiriaki et al., which uses a coarse comparator for higher voltages and a fine comparator for lower voltages so that the fine comparator is not subject to the high voltages that might cause errors due to the hysteresis effect.

However, these proposals include complex control logic, considerable additional circuitry, or combinations thereof. The inventors have appreciated that there is a need to provide new apparatuses and methods that simplify and improve error reduction in ADCs by limiting a voltage range applied to a comparator.

BRIEF SUMMARY

Embodiments discussed herein include apparatuses and methods for reducing errors in ADCs by limiting a voltage range applied to a comparator of an ADC.

In some embodiments of the present invention a successive approximation ADC includes a comparator with a first input coupled to a common model signal, a second input coupled to a compare input, and a comparator output. Control logic is configured to generate one or more control signals responsive to the comparator output. A capacitor array includes first sides of capacitors operably coupled to an array output. The capacitor arrays is configured to selectively couple each of second sides of the capacitors to an analog input signal and one or more input reference signals responsive to the one or more control signals. A voltage limiter is operably coupled between the array output and the compare input and is configured to limit a voltage on the compare input to within a predefined range relative to the array output.

In other embodiments of the present invention, methods are configured to reduce errors in a successive approximation ADC. The methods include comparing a common model signal to a compare input to generate a comparator output. One or more control signals are generated responsive to the comparator output. A first side of a capacitor array is operably coupled to an array output. Second sides of capacitors of the capacitor array are selectively coupled to an analog input signal and one or more input reference signals responsive to the one or more control signals. The compare input is limited to within a predefined range relative to the array output with a voltage limiter operably coupled between the array output and the compare input.

In other embodiments of the present invention a successive approximation ADC includes a comparator with a first input coupled to a first compare input, a second input coupled to a second compare input, and a comparator output. Control logic is configured to generate one or more control signals responsive to the comparator output. A first capacitor array includes first sides of first capacitors operably coupled to a first array output. The first capacitor array is configured to selectively couple each of second sides of the first capacitors to an analog input signal and one or more input reference signals responsive to the one or more control signals. A second capacitor array includes first sides of second capacitors operably coupled to a second array output. The second capacitor array is configured to selectively couple each of second sides of the second capacitors to the analog input signal and the one or more input reference signals responsive to the one or more control signals. A first voltage limiter is operably coupled between the first array output and the first compare input and is configured to limit a voltage on the first compare input within a first predefined range relative to the first array output. A second voltage limiter is operably coupled between the second array output and the second compare input, and is configured to limit a voltage on the second compare input within a second predefined range relative to the second array output.

In still other embodiments of the present invention, methods are configured to reduce errors in a successive approximation ADC. The methods includes comparing a first compare input to a second compare input to generate a comparator output. One or more control signals are generated responsive to the comparator output. A first side of a first capacitor array is operably coupled to a first array output. Second sides of first capacitors of the first capacitor array are selectively coupled to an analog input signal and one or more input reference signals responsive to the one or more control signals. The first compare input is limited to within a first predefined range relative to the first array output with a first voltage limiter operably coupled between the first array output and the first compare input. A first side of a second capacitor array is operably coupled to a second array output. Second sides of second capacitors of the second capacitor array are selectively coupled to the analog input signal and one or more input reference signals responsive to the one or more control signals. The second compare input is limited to within a second predefined range relative to the second array output with a second voltage limiter operably coupled between the second array output and the compare input.

DETAILED DESCRIPTION

Figure 1:
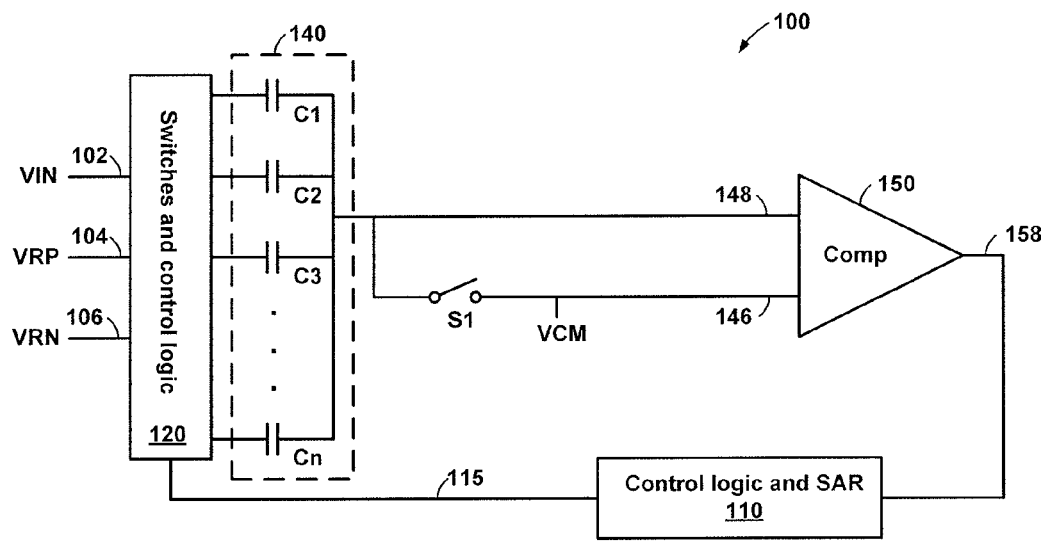
FIG. 1 is a simplified schematic diagram of a conventional successive approximation ADC.

In the following description, elements, circuits, and functions may be shown in block diagram form in order not to obscure the present invention in unnecessary detail. Conversely, specific implementations shown and described are exemplary only and should not be construed as the only way to implement the present invention unless specified otherwise herein. Additionally, block definitions and partitioning of logic between various blocks is exemplary of a specific implementation. It will be readily apparent to one of ordinary skill in the art that the present invention may be practiced by numerous other partitioning solutions. For the most part, details concerning timing considerations and the like have been omitted where such details are not necessary to obtain a complete understanding of the present invention and are within the abilities of persons of ordinary skill in the relevant art.

Furthermore, in this description of embodiments of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. The following detailed description is not to be taken in a limiting sense, and the scope of the present invention is defined only by the appended claims.

Those of ordinary skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus of signals, wherein the bus may have a variety of bit widths and the present invention may be implemented on any number of data signals including a single data signal.

The terms "assert" and "negate" may be respectively used when referring to the rendering of a signal, status bit, or similar apparatus into its logically true or logically false state. If the logically true state is a logic level one, the logically false state will be a logic level zero. Conversely, if the logically true state is a logic level zero, the logically false state will be a logic level one.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise a set of elements may comprise one or more elements.

Elements described herein may include multiple instances of the same element. These elements may be generically indicated by a numerical designator (e.g. 110) and specifically indicated by the numerical indicator followed by an alphabetic designator (e.g., 110A) or a numeric indicator preceded by a "dash" (e.g., 110-1). For ease of following the description, for the most part element number indicators begin with the number of the drawing on which the elements are introduced or most fully discussed. Thus, for example, element identifiers on a FIG. 1 will be mostly in the numerical format 1xx and elements on a FIG. 4 will be mostly in the numerical format 4xx.

When describing circuit elements, such as, for example, resistors, capacitors, and transistors, designators for the circuit elements begin with an element type designator (e.g., R, C, M) followed by a numeric indicator. Circuit element numbers may be repeated on different drawings and are not to be considered the same element unless expressly indicated as such. In other words, a capacitor C1 on FIG. 1 is a different element from a capacitor C1 on FIG. 6. Power sources such as, for example VDD and VCC as well as ground voltages may be generically indicated. When appropriate, these power signals may be described in detail. In other cases, the power signals may not be described, as it would be apparent to a person of ordinary skill in the art which power signal should be used. As a non-limiting example, it may be appropriate to maintain separate analog and digital grounds and a person of ordinary skill in the art would understand which is the appropriate ground for a specific circuit.

Embodiments discussed herein include apparatuses and methods for reducing errors in ADCs by limiting a voltage range applied to a comparator of an ADC.

FIG. 1 is a simplified schematic diagram of a conventional successive approximation ADC 100. A capacitor array 140 is configured with one side of the capacitors C1-Cn coupled together and coupled to a first input 148 of a comparator 150. Logic block 120 includes switches and control logic to selectively switch an analog input signal 102, a low input reference signal 106 (VRN), and a high input reference signal 104 (VRP) onto input terminals of the capacitors C1-Cn. A common model signal 146 is coupled to a second input of the comparator 150. The common model signal 146 can be selectively coupled to the coupled sides of the capacitor array 140. A comparator output 158 is generated by the comparator resulting from a comparison of the first input 148 and the second input 146. Logic block 110 includes control logic for performing the successive approximation in response to the comparison output and generates control signals 115 for controlling the switches and control logic of logic block 120.

Figure 2:
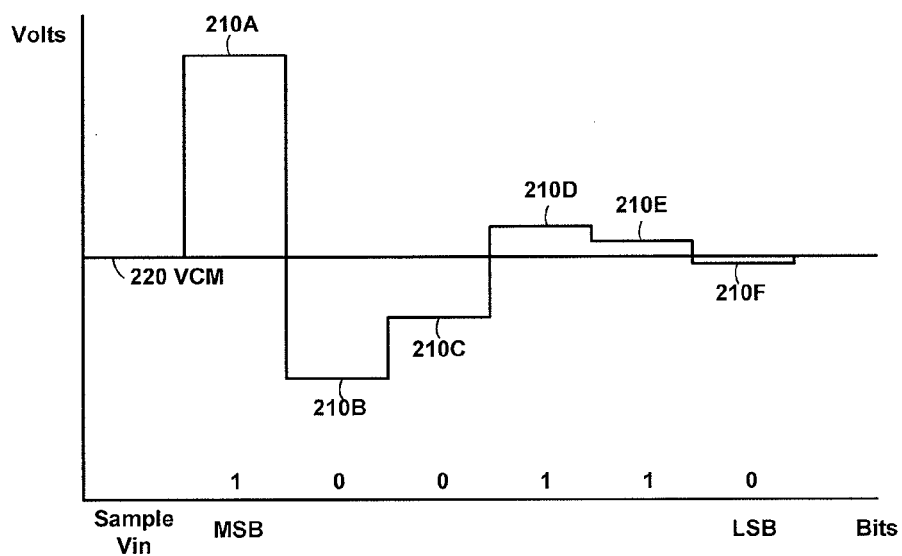
FIG. 2 is a simplified timing diagram illustrating successive approximation cycles for the successive approximation ADC of FIG. 1.

FIG. 2 is a simplified timing diagram illustrating successive approximation cycles for the successive approximation ADC of FIG. 1. General function of a successive approximation ADC 100 should be understood by a person of ordinary skill in the art and a brief description of the basic operation is included herein to provide context for an understanding of embodiments of the present invention.

The basic operation will be described with reference to FIGS. 1 and 2. At the beginning of a conversion cycle, the analog input signal 102 may be sampled by the successive approximation ADC 100. This sampling may be accomplished by closing the reference switch S1 such that a reference voltage from the common model signal 146 is place on the coupled sides 148 of the capacitor array 140. Logic block 120 selects switches such that the analog input signal 102 is placed on the input side of each capacitor of the capacitor array 140. After the sampling, the reference switch S1 is open and the analog input signal 110 is disconnected from the capacitor array 140.

After sampling, the capacitor array has a voltage difference between its input terminals and its output terminals of $V_{SAMPLE}=(V_{CM}-V_{IN})$ and the second side of the comparator is set to the voltage of the common model signal 146 $V_{CM}$. The common model signal 146 may be configured as an arbitrary but constant voltage, which is typically mid-way between the comparator's input range or power supply voltages, such as VDD and GND.

In many successive approximation ADCs 100, the capacitor array is configured with a total capacitance of C. In such cases, for a 6-bit ADC, a first capacitor C1 may have a capacitance of ½ C, a second capacitor C2 may have a capacitance of ¼ C, a third capacitor C3 may have a capacitance of ⅛ C, a fourth capacitor C4 may have a capacitance of 1/16 C, a fifth capacitor C5 may have a capacitance of 1/32 C, a sixth capacitor C6 may have a capacitance of 1/64 C, and a final capacitor Cn may have a capacitance of 1/64 C such that the total capacitance sums to C.

To successively approximate the voltage that was sampled onto the capacitors during the sample phase, the control logic 110 then steps through each of the capacitors in the array and places either the high input reference signal 104 or the low input reference signal 106 on the input side of each of the capacitors in the capacitor array 140 based on comparison results from the previous approximation. As a result, each successive approximation adds another bit to the digital result, starting with the Most Significant bit (MSB) from C1 and ending with the Least Significant Bit (LSB) from C6 in the example 6-bit ADC.

For the example illustrated in FIG. 2 the common model signal 146 is illustrated as waveform 220 at about a midway point on the voltage scale. The successive approximation is represented by waveform 210.

At the first approximation, the MSB evaluates to "1" because the voltage 210A placed on the compare input 148 is greater than the voltage of waveform 220. In the second successive approximation, the next bit evaluates to "0" because the voltage 210B placed on the compare input 148 is less than the voltage of waveform 220. In the third successive approximation, the next bit evaluates to "0" because the voltage 210C placed on the compare input 148 is less than the voltage of waveform 220. In the fourth successive approximation, the next bit evaluates to "1" because the voltage 210D placed on the compare input 148 is greater than the voltage of waveform 220. In the fifth successive approximation, the next bit evaluates to "1" because the voltage 210E placed on the compare input 148 is greater than the voltage of waveform 220. In the final successive approximation, the LSB evaluates to "0" because the voltage 210F placed on the compare input 148 is less than the voltage of waveform 220.

Figure 3:
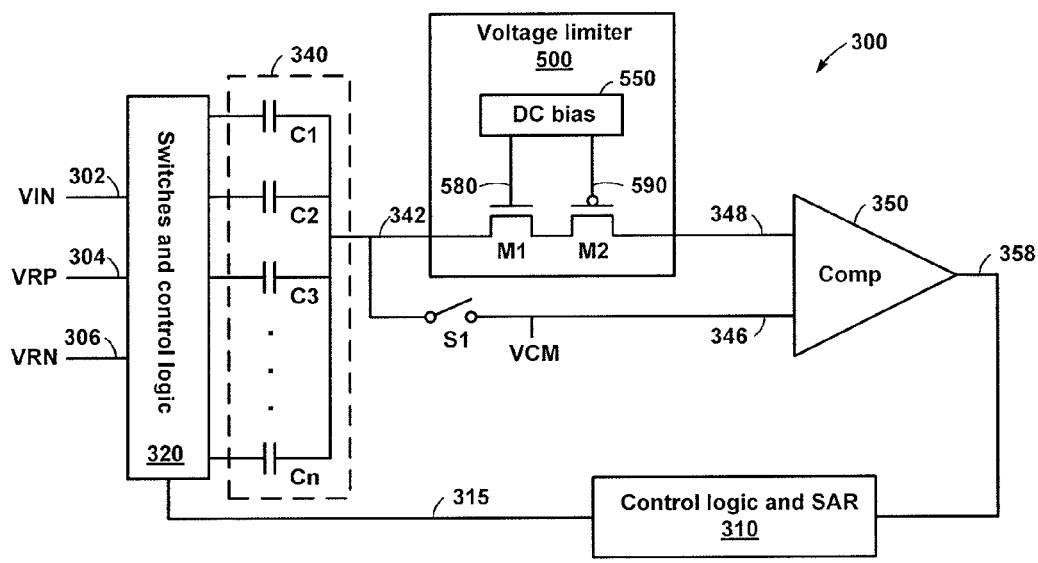
FIG. 3 is a simplified schematic diagram of a successive approximation ADC with a voltage limiter according to one or more embodiments of the invention.

FIG. 3 is a simplified schematic diagram of a successive approximation ADC 300 with a voltage limiter 500 according to one or more embodiments of the invention. A capacitor array 340 is configured with one side of the capacitors C1-Cn coupled together as an array output 342 (may also be referred to as first sides of capacitors C1-Cn). A compare input 348 is coupled to a first input of a comparator 350. Logic block 320 includes switches and control logic to selectively switch an analog input signal 302 (VIN), a low input reference signal 306 (VRN), and a high input reference signal 304 (VRP) onto each of the input terminals of the capacitors C1-Cn. The input terminals of the capacitors C1-Cn may also be referred to as second sides of capacitors C1-Cn. A common model signal 346 is coupled to a second input of the comparator 150. The common model signal 346 can be selectively coupled to the coupled to the array output 342 by a reference switch S1. A comparator output 358 is generated by the comparator 350 resulting from a comparison of the compare input 348 and the common model signal 346. Logic block 310 includes control logic for performing the successive approximation in response to the comparison output and generates control signals 315 for controlling the switches and control logic of logic block 120. Logic blocks 310 and 320 may be collectively referred to herein as control logic and control signals referred to herein may include control signals 315 as well as control signals for switches (not shown) within logic block 320.

Operation of the successive approximation ADC 300 of FIG. 3 is similar to that of FIG. 1 and those portions that are similar need not be repeated again. Of course, a person of ordinary skill in the art will recognize that the high input reference signal 304 and the low input reference signal 306 may be at various voltage levels to achieve different results. In addition, the definition of a "1" and a "0" relative to the comparison results may depend on specific implementations of the comparator 350, control logic, and capacitor array 340.

In the FIG. 3 embodiment, a voltage limiter 500 is operably coupled between the array output 342 and the compare input 348. As stated above, one source of errors in conventional successive approximation ADCs is a time-dependent and voltage-dependent threshold shift in MOS transistors used in the comparison circuitry. This threshold shift is often referred to as a hysteresis effect. The relatively high voltages that may be placed on inputs of the comparison circuitry during early stages of a SAR process can cause large overdrive of comparator inputs, which may result in a significant threshold shift effect that can cause errors in the ADC. The voltage limiter 500 may be configured to limit excessively high and low voltages seen at the array output 342 to within a predefined range, while still passing an accurate voltage on the array output 342 to the compare input 348 for voltages within the predefined range.

The voltage limiter 500 includes a bias generator 550 for generating bias signals 580 and 590 for series-coupled transistors M1 and M2. The voltages of the bias signals 580, 590 may be set at various voltage levels to determine the predefined range.

As a non-limiting example, n-channel transistor M1 may have a threshold voltage $V_{thn}$ of 1.0 V and p-channel transistor M2 may have a threshold voltage $V_{thp}$ of 1.0 V. If the bias signal 580 is set at 3.0 V, an upper limit on the predetermined range would be about:

$$V_{biasM1} - V_{thn} = 3.5 - 1.0 = 2.5 \text{ V}.$$

Similarly, If the bias signal 590 is set at 0.5 V, a lower limit on the predetermined range would be about:

$$V_{biasM2} + V_{thp} = 0.5 + 1.0 = 1.5 \text{ V}.$$

With these values, a voltage of less than 1.5 V on the array output 342 would be set to about 1.5 V on the compare input 348. Similarly, a voltage of greater than 2.5 V on the array output 342 would be set to about 2.5 V on the compare input 348. Voltages between 1.5 V and 2.5 V on the array output 342 would be set to substantially the same voltage on the compare input 348.

Figure 4:
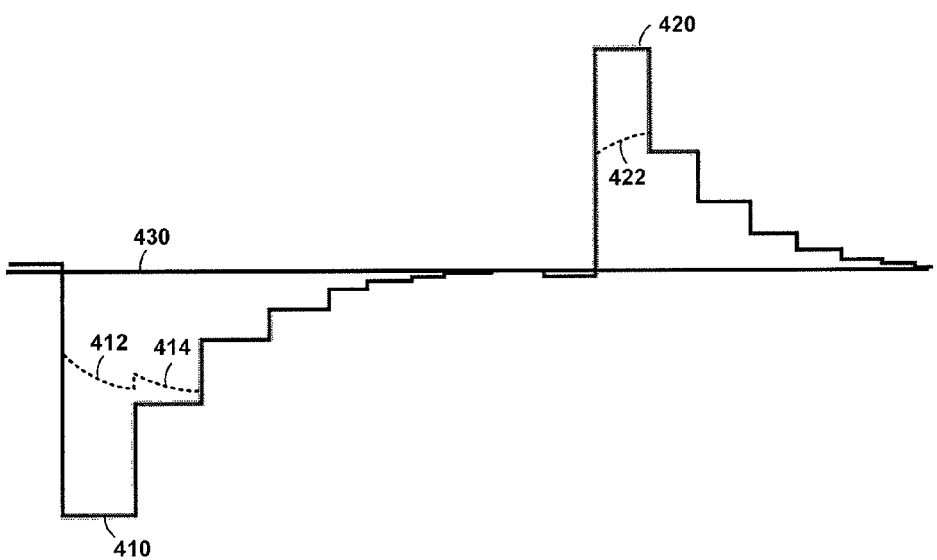
FIG. 4 is a simplified timing diagram illustrating successive approximation cycles for the successive approximation ADC of FIG. 3.

FIG. 4 is a simplified timing diagram illustrating successive approximation cycles for the successive approximation ADC of FIG. 3. Reference is made to both FIG. 4 and FIG. 3 in describing the voltage limiting that may occur for embodiments of the present invention. Waveform 430 represents the common model signal 346 to which the successive approximations are compared. In FIG. 4, a first 8-bit successive approximation evaluates as all zeros as illustrated by waveform 410 being lower than waveform 430 for all 8 bits of the approximation. FIG. 4 also illustrates a second 8-bit successive approximation that evaluates as all ones as illustrated by waveform 420 being higher than waveform 430 for all 8 bits of the approximation. Waveforms 410 and 420 illustrate the voltages on the compare input 348 if the voltage limiter 500 is not included such that the array output 342 is directly coupled to the compare input 348.

In embodiments of the present invention with the voltage limiter 500 serially coupled between the array output 342 and the compare input 348, waveform 412 illustrates how the voltage on the compare input 348 may be limited to a voltage closer to waveform 430 when evaluating the MSB for waveform 410. Waveform 414 illustrates how the voltage on the compare input 348 may be limited to a voltage closer to waveform 430 when evaluating the MSB-1 for waveform 410. Similarly, waveform 422 illustrates how the voltage on the compare input 348 may be limited to a voltage closer to waveform 430 when evaluating the MSB for waveform 420. Waveforms 412, 414, and 422 are illustrated as converging to an evaluation value with a curved slope to better illustrate them relative to a conventional evaluations. However, in many embodiments, the rise or fall to the proper voltage for evaluation may occur much faster. The curves on waveforms 412, 414, and 422 are not intended to imply that reaching the evaluation voltage is any slower than a conventional implementation. Moreover, since the voltage transition to the evaluation voltage in embodiments of the present invention may be less than that for a convention implementation, embodiments of the present invention may actually reach the evaluation voltage faster than a convention implementation.

Figure 5:
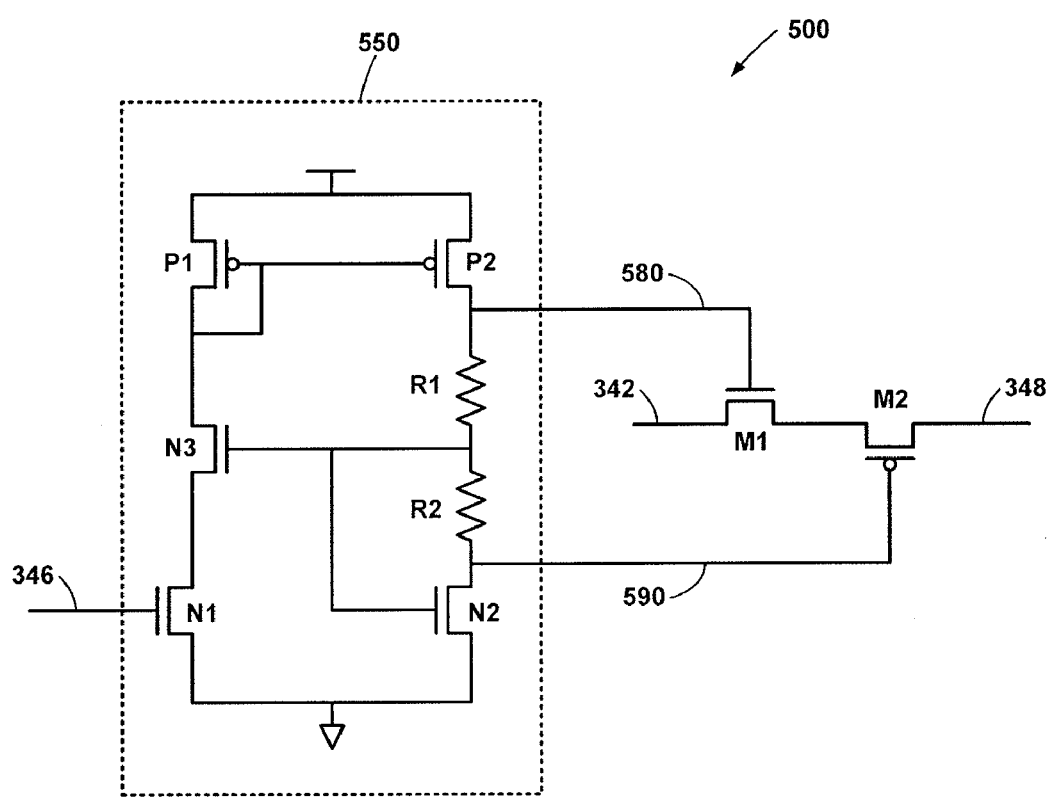
FIG. 5 is a simplified schematic diagram of an embodiment of a voltage limiter.

FIG. 5 is a simplified schematic diagram of an embodiment of a voltage limiter 500. Transistors M1 and M2 are the same as those illustrated in FIG. 3. In addition, bias signals 580, 590, array output 342, and compare input 348 are the same as those illustrated in FIG. 3. Additional details for one possible embodiment of the bias generator 550 are also illustrated.

The bias generator 550 may be configured with a current mirror including p-channel transistors P1 and P2 coupled to a power supply. An n-channel transistor N1 is coupled to ground and in series with n-channel transistor N3 to create a controlled current source for the current mirror. The gate of n-channel transistor N1 is coupled to the common model signal 346.

With reference to FIGS. 3 and 5, on the mirrored side, n-channel transistor N2 is coupled to ground and in series with p-channel transistor P2, first resistor R1 and second resistor R2. First resistor R1 and second resistor R2 create a voltage divider that can be adjusted to create a feedback signal to drive the gates of transistors N2 and N3. In addition, the resistance values of R1 and R2 can be adjusted to generate different voltage values for the n-channel bias signal 580 (may also be referred to herein as a first DC bias signal 580) and the p-channel bias signal 590 (may also be referred to herein as a second DC bias signal 590). The bias generator 550 of FIG. 5 allows a large selection of voltages for bias signals 580 and 590, which, as explained above, may be used to set the predefined range for the voltage limiter 500. With the common model signal 346 controlling the bias generator 550, the bias signals 580 and 590 may be set relative to the common model signal 346 such that the predefined range for the compare input 348 may be set to give appropriate range and distribution relative to the common model signal 346, which is used in the comparison with the compare input 348 in the comparator 350. Moreover, resistors R1 and R2 may be configured as variable resistors such that the voltage levels on bias signals 580 and 590 may be easily modified. The bias generator 550 of FIG. 5 is on example of a bias generator that may be used in embodiments of the present invention. However, it should be understood that other bias generators configured to create bias signals 580 and 590 at appropriate values may also be used.

Figure 6:
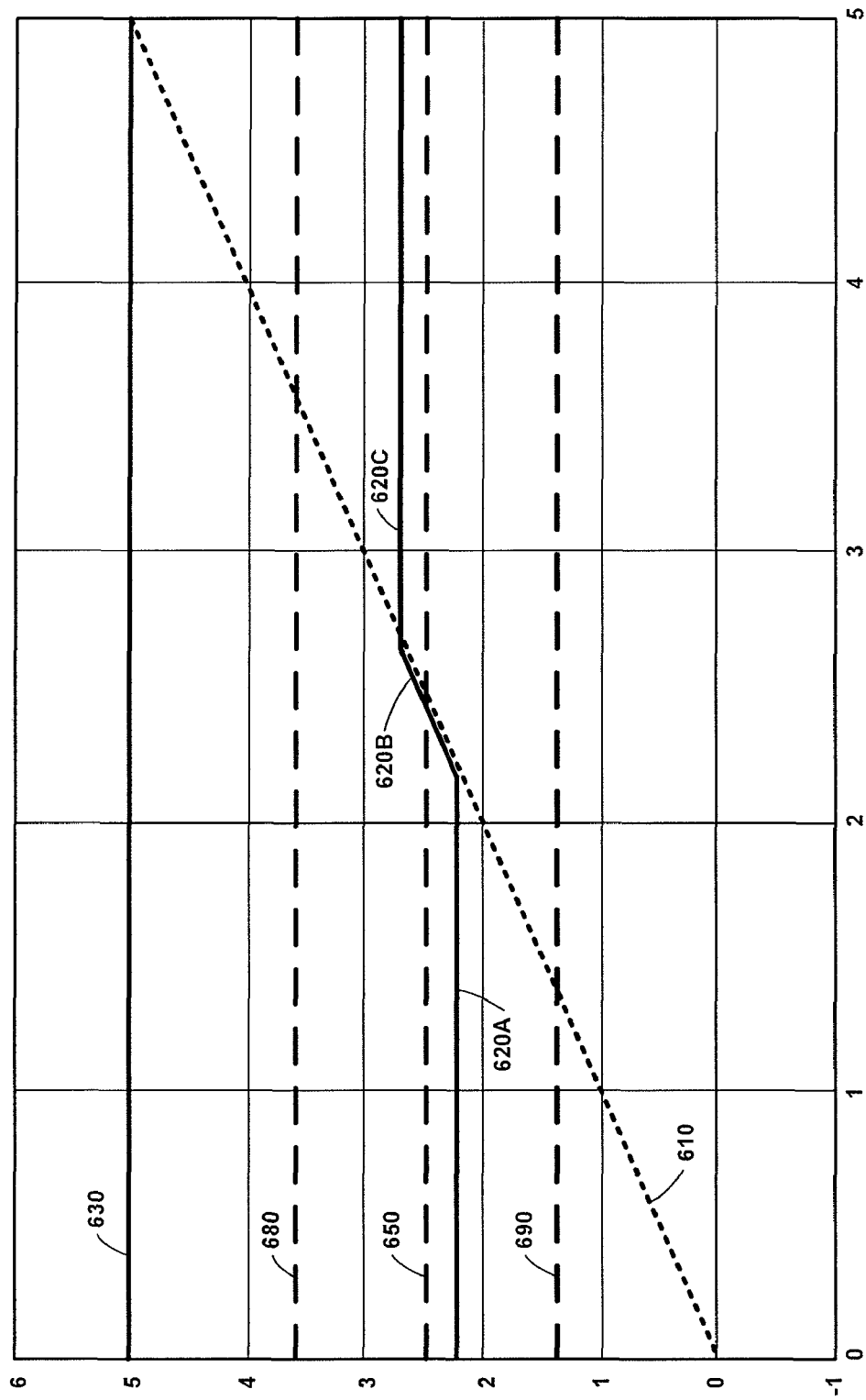
FIG. 6 is a graph showing how the voltage limiter of FIG. 5 operates within a comparison range and outside the comparison range.

FIG. 6 is a graph showing how the voltage limiter 500 (FIG. 5) operates within a comparison range and outside the comparison range. The graph of FIG. 6 is not intended to show operation during a successive approximation operation. Rather, the FIG. 6 graph is intended to show how the voltage limiter 500 responds to various input voltage levels.

FIG. 6 is a simulation result for the voltage limiter 500 and bias generator 550 illustrated in FIG. 5 and FIG. 5 will also be referred to in the description of FIG. 6. Waveform 630 illustrates a power supply voltage of about 5.0 V. Waveform 680 illustrates a voltage level for the n-channel bias signal 580 of about 3.6 V. Waveform 690 illustrates a voltage level for the p-channel bias signal 590 of about 1.4 V. Waveform 650 illustrates a voltage level for the common model signal 346 of about 2.5 V. Generally, during operation, the power supply voltage 630, n-channel bias signal voltage 680, p-channel bias signal voltage 690, and common model signal voltage 650 will be Direct Current (DC) voltage levels as illustrated in FIG. 6.

Waveform 610 illustrates a constant ramp voltage for the array output 342 from about 0.0 V to about 5.0 V. This constant ramp is shown to illustrate the response of the voltage limiter 500 to different voltage values on the array output 342. The output from the voltage limiter 500 (i.e., the compare input 348) is illustrated by waveform 620. A first segment 620A of waveform 620 illustrates that when waveform 610 is below the predefined range, the compare input 348 is held to about 2.3 volts. As discussed above, this lower limit (may also be referred to herein as a lower voltage) is determined by the of the p-channel bias signal voltage 690 plus a p-channel threshold voltage of p-channel device M2, which is about 0.9 V in this example.

Similarly, a third segment 620C of waveform 620 illustrates that when waveform 610 is above the predefined range, the compare input 348 is held to about 2.7 volts. This upper limit (may also be referred to herein as an upper voltage) is determined by the n-channel bias signal voltage 680 minus an n-channel threshold voltage of n-channel device M1, which is about 0.9 V in this example.

A second segment 620B of waveform 620 illustrates where the compare input 348 follows the array output 342 (represented by waveform 610). Thus, within the predefined range of about 2.3 V to about 2.7 V, the voltage on the compare input 348 will be about the same voltage as that of the array output 342. Outside the predetermined range, the voltage on the compare input 348 will be held to the lower limit or the upper limit. Waveform 620 is shown as skewed slightly to the right so that both second segment 620B and waveform 610 can be seen in this region.

Figure 7:
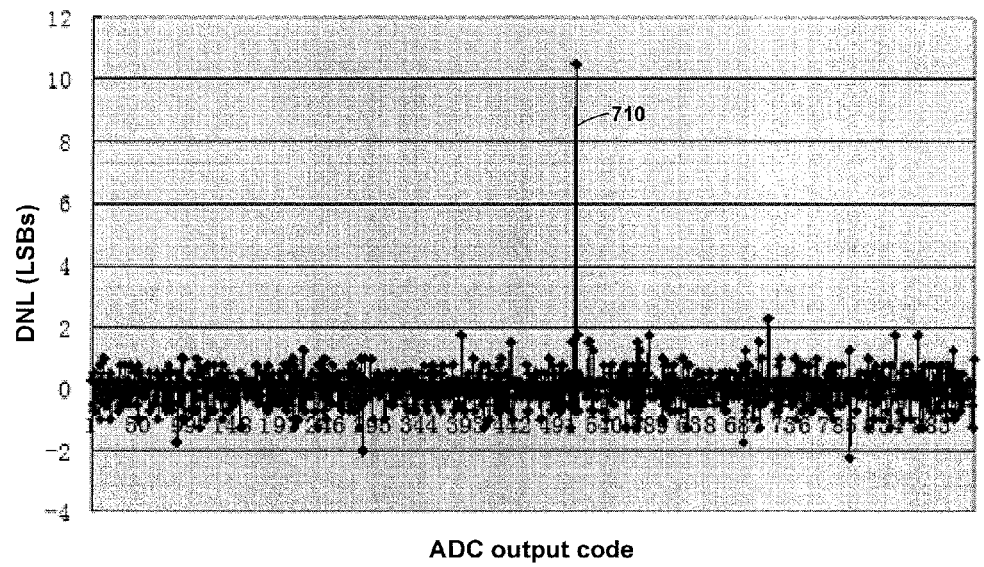
FIG. 7 is a graph of differential non-linearity (DNL) that may occur during a successive approximation ADC without the voltage limiter.

FIG. 7 is a graph of differential non-linearity (DNL) that may occur during operation of a successive approximation ADC 300 without the voltage limiter 500 (FIG. 3).

Figure 8:
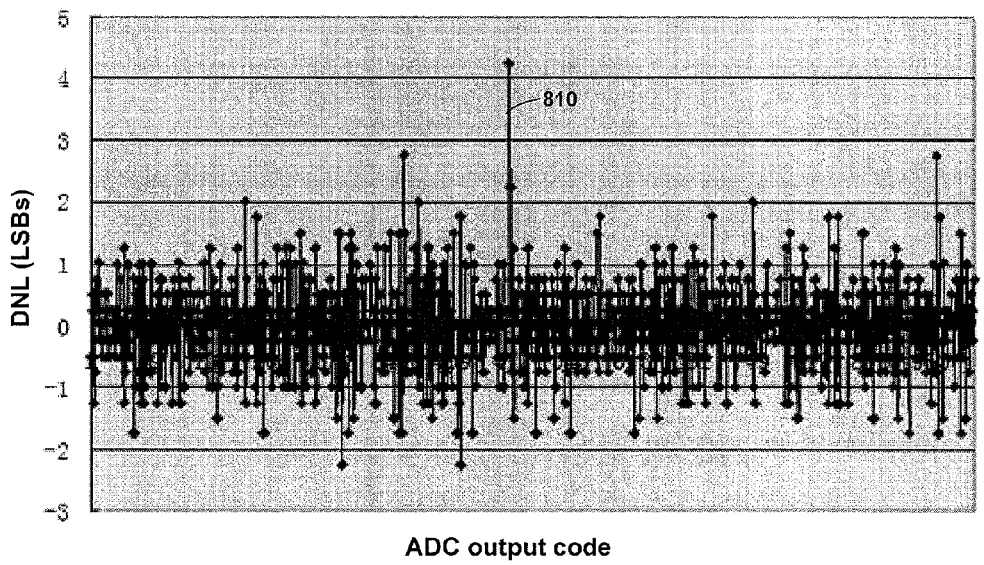
FIG. 8 is a graph of DNL that may occur during a successive approximation ADC with the voltage limiter.

FIG. 8 is a graph of DNL that may occur during operation of a successive approximation ADC 300 using a voltage limiter 500 (FIG. 3) according to one or more embodiments of the invention.

As is understood by a person of ordinary skill in the art, the difference between the ideal LSB and the worst case actual input voltage change between output code transitions is called Differential Non-Linearity (DNL). For example, in an 8-bit ADC, these changes are separated from each other by $\frac{1}{256}$th of full-scale. In other words, DNL is a measure of imprecision that may occur in ADCs relative to what the digital value should be based on the sampled analog value.

FIGS. 7 and 8 are histograms that indicate a statistical measure of how large the imprecision may be for measurements of given ADC output codes in terms of LSBs. In other words, for a given ADC output code (e.g., a 10-bit ADC would have 1024 different output codes) the histogram illustrates how large the imprecision may be in number of LSBs.

In one way to arrive at a DNL histogram, a repetitive dynamic signal, such as a sine wave is applied to the ADC, which generates a corresponding distribution of digital output codes. Deviations from the expected output code distribution results in errors that are plotted for each output code.

In FIG. 7, spike 710 illustrates a large number of errors that occurred for a specific ADC output code in the successive approximation ADC 300 of FIG. 3 without the voltage limiter 500. In other words, the DNL graph of FIG. 7 was generated with the successive approximation ADC 300 of FIG. 3 but with the voltage limiter 500 removed such that the array output 342 is tied directly to the compare input 348. The large number of errors may occur due to the hysteresis effect discussed above when a large voltage is placed on an input of the comparator 350.

In FIG. 8, spike 810 illustrates that there may be still be a number of errors in comparisons of large voltages. However, note that the difference in scale for the DNL of FIG. 7 relative to the DNL for FIG. 8. The spike 810 in the successive approximation ADC 300 with the voltage limiter 500 is only about 4 whereas the spike 710 in the successive approximation ADC 300 without the voltage limiter 500 is about 10.

Figure 9:
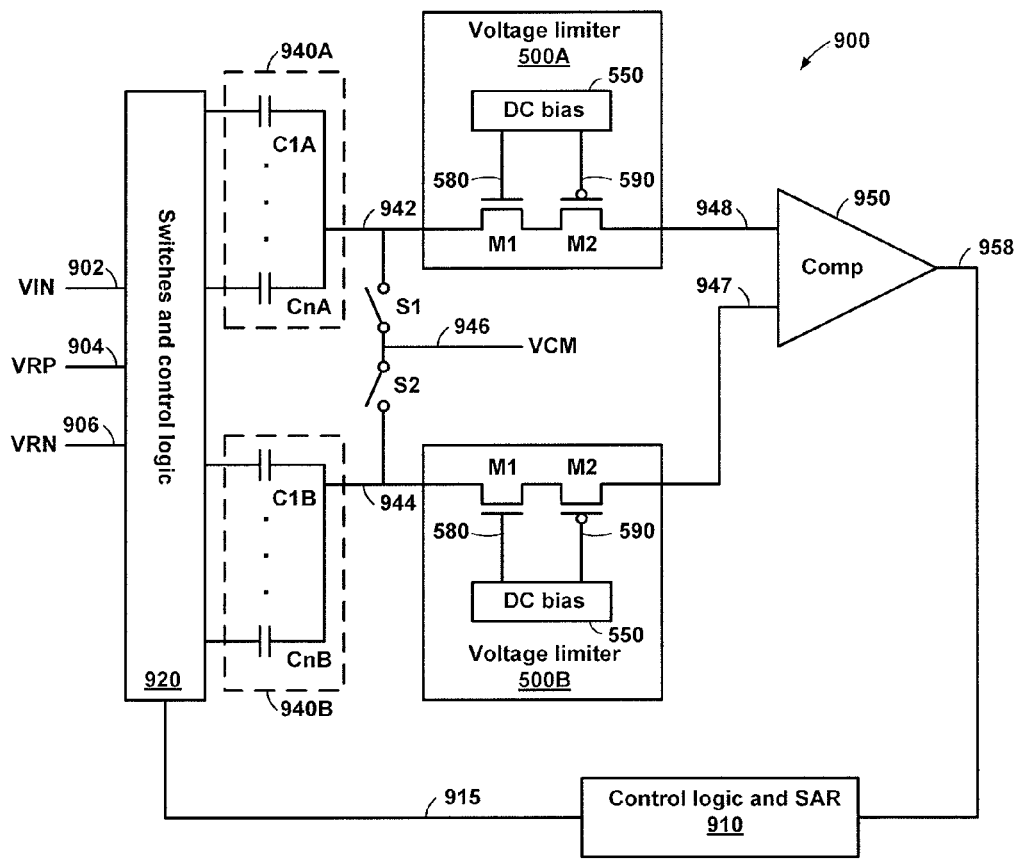
FIG. 9 is a simplified schematic diagram of a differential successive approximation ADC with voltage limiters according to one or more embodiments of the invention.

FIG. 9 is a simplified schematic diagram of a differential successive approximation ADC 900 with two voltage limiters 500A, 500B according to one or more embodiments of the invention. A first capacitor array 940A may be configured with one side of first capacitors C1A-CnA coupled together as a first array output 942. A first compare input 948 is coupled to a first input of the comparator 950. A second capacitor array 940B may be configured with one side of second capacitors C1B-CnB coupled together as a second array output 944. A second compare input 947 is coupled to a second input of the comparator 950.

Logic block 920 includes switches and control logic to selectively switch an analog input signal 902 (VIN), a low input reference signal 906 (VRN), and a high input reference signal 904 (VRP) onto each of the input terminals of the first capacitors C1A-CnA and the second capacitors C1B-CnB. A common model signal 946 is selective coupled to each of the first array output 942 and the second array output 944 through switches S1, and S2, respectively.

A comparator output 958 is generated by the comparator 950 resulting from a comparison of the first compare input 948 and the second compare input 947. Logic block 910 includes control logic for performing the successive approximation in response to the comparison output and generates control signals 915 for controlling the switches and control logic of logic block 920. Logic blocks 910 and 920 may be collectively referred to herein as control logic and control signals referred to herein may include control signals 915 as well as control signals for switches (not shown) within logic block 920.

A first voltage limiter 500A is operably coupled between the first array output 942 and the first compare input 948. Similarly, a second voltage limiter 500B is operably coupled between the second array output 944 and the second compare input 947. Operation and structure of the voltage limiters 500A and 500B are similar to the operation described above with reference to FIGS. 3-6.

Operation of the differential successive approximation ADC 900 of FIG. 9 is similar to the successive approximation ADC 300 of FIG. 3 except that a differential voltage is compared at comparator 950 rather a single voltage. Therefore, operation of the differential successive approximation ADC 900 is only described where it might be different from the successive approximation ADC 300 of FIG. 3. During the sampling phase, the analog input signal 902 is placed on one side of all the first capacitors C1A-CnA and the second capacitors C1B-CnB. Also during the sampling phase, the common model signal 946 is placed on the other side of all the first capacitors C1A-can and the second capacitors C1B-CnB through switches S1 and S2, respectively. The second capacitor array 940B may be configured to switch the input signals 904 and 906 in a manner opposite from the first capacitor array 940A. In other words, during the successive approximation cycles, if the high input reference signal 904 is to be placed on certain first capacitors C1A-CnA, corresponding second capacitors C1B-CnB would have the low input reference signal 906 placed thereon. In this way, the successive approximation of the bottom side proceeds opposite to the successive approximation on the low side. For example, referring to FIG. 2, this means that in some embodiments the waveform 210 would appear as is for the first compare input 948 and the second compare input 947 would have a mirror image (mirrored approximately about waveform 220) of the waveform 210.

While the present invention has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. A successive approximation ADC, comprising:
a comparator including a first input coupled to a common model signal, a second input coupled to a compare input, and a comparator output;
control logic configured to generate one or more control signals responsive to the comparator output;
a capacitor array having first sides of capacitors of the capacitor array operably coupled to an array output and configured to selectively couple each of second sides of the capacitors to an analog input signal and one or more input reference signals responsive to the one or more control signals; and
a voltage limiter operably coupled between the array output and the compare input and is configured to limit a voltage on the compare input to within a predefined range relative to the array output.

2. The successive approximation ADC of claim 1, wherein the voltage limiter further comprises:
a bias generator configured to generate at least two bias signals; and
at least two series-coupled transistors operably coupled in series between the array output and the compare input each of the at least two series-coupled transistors configured to be controlled by one of the at least two bias signals.

3. The successive approximation ADC of claim 2, wherein:
the bias generator is further configured to generate an n-channel bias signal and a p-channel bias signal; and
the at least two series-coupled transistors comprise an n-channel device having a gate operably coupled to the n-channel bias signal and a p-channel device having a gate operably coupled to the p-channel bias signal.

4. The successive approximation ADC of claim 3, wherein the bias generator is further configured to generate the n-channel bias signal at least an n-channel threshold voltage above the common model signal and generate the p-channel bias signal at least a p-channel threshold voltage below the common model signal.

5. The successive approximation ADC of claim 1, wherein the predefined range comprises a range substantially between a first DC bias signal above the common model signal and a second DC bias signal below the common model signal.

6. The successive approximation ADC of claim 1, wherein the predefined range comprises a range substantially between an upper voltage and a lower voltage, the upper voltage comprising a first DC bias signal less an n-channel threshold voltage and the lower voltage comprising a second DC bias signal plus a p-channel threshold voltage.

7. A method of reducing errors in a successive approximation ADC, comprising:
comparing a common model signal to a compare input to generate a comparator output;
generating one or more control signals responsive to the comparator output;
selectively coupling second sides of capacitors of a capacitor array to an analog input signal and one or more input reference signals responsive to the one or more control signals wherein a first side of the capacitor array is operably coupled to an array output; and
limiting the compare input within a predefined range relative to the array output with a voltage limiter operably coupled between the array output and the compare input.

8. The method of claim 7, wherein limiting the compare input further comprises:
generating at least two bias signals;
biasing at least two series-coupled transistors operably coupled in series between the array output and the compare input with the at least two bias signals.

9. The method of claim 8, wherein:
generating the at least two bias signals further comprises generating an n-channel bias signal and generating a p-channel bias signal; and
biasing the at least two series-coupled transistors further comprises biasing an n-channel device with the n-channel bias signal and biasing a p-channel device with the p-channel bias signal.

10. The method of claim 7, wherein the predefined range comprises a range substantially between a first DC bias signal above the common model signal and a second DC bias signal below the common model signal.

11. The method of claim 7, wherein the predefined range comprises a range substantially between an upper voltage and a lower voltage, the upper voltage comprising a first DC bias signal less an n-channel threshold voltage and the lower voltage comprising a second DC bias signal plus a p-channel threshold voltage.

12. A successive approximation ADC, comprising:
a comparator including a first input coupled to a first compare input, a second input coupled to a second compare input, and a comparator output;
control logic configured to generate one or more control signals responsive to the comparator output;
a first capacitor array having first sides of first capacitors of the first capacitor array operably coupled to a first array output and configured to selectively couple each of second sides of the first capacitors to an analog input signal and one or more input reference signals responsive to the one or more control signals;
a second capacitor array having first sides of second capacitors of the second capacitor array operably coupled to a second array output and configured to selectively couple each of second sides of the second capacitors to the analog input signal and the one or more input reference signals responsive to the one or more control signals;
a first voltage limiter operably coupled between the first array output and the first compare input, the first voltage limiter configured to limit a voltage on the first compare input within a first predefined range relative to the first array output; and
a second voltage limiter operably coupled between the second array output and the second compare input, the second voltage limiter configured to limit a voltage on the second compare input within a second predefined range relative to the second array output.

13. The successive approximation ADC of claim 12, wherein the first voltage limiter and the second voltage limiter each further comprise:
a bias generator configured to generate at least two bias signals; and
at least two series-coupled transistors operably coupled in series between the array output and the compare input each of the at least two series-coupled transistors configured to be controlled by one of the at least two bias signals.

14. The successive approximation ADC of claim 13, wherein:
the bias generator is further configured to generate an n-channel bias signal and a p-channel bias signal; and the at least two series-coupled transistors comprise an n-channel device having a gate operably coupled to the n-channel bias signal and a p-channel device having a gate operably coupled to the p-channel bias signal.

15. The successive approximation ADC of claim 12, wherein the first predefined range and the second predefine range each comprise a range substantially between a first DC bias signal above a common model signal and a second DC bias signal below the common model signal.

16. The successive approximation ADC of claim 12, wherein the first predefined range and the second predefined range each comprise a range substantially between a threshold voltage of a p-channel device above a common model signal and threshold voltage of an n-channel device below the common model signal.

17. A method of reducing errors in a successive approximation ADC, comprising:
    comparing a first compare input to a second compare input to generate a comparator output;
    generating one or more control signals responsive to the comparator output;
    selectively coupling second sides of first capacitors of a first capacitor array to an analog input signal and one or more input reference signals responsive to the one or more control signals wherein a first side of the first capacitor array is operably coupled to a first array output;
    limiting the first compare input within a first predefined range relative to the first array output with a first voltage limiter operably coupled between the first array output and the first compare input;
    selectively coupling second sides of second capacitors of a second capacitor array to the analog input signal and one or more input reference signals responsive to the one or more control signals wherein a first side of the second capacitor array is operably coupled to a second array output; and
    limiting the second compare input within a second predefined range relative to the second array output with a second voltage limiter operably coupled between the second array output and the compare input.

18. The method of claim 17, wherein:
    limiting the first compare input further comprises:
        generating at least two bias signals; and
        biasing at least two series-coupled transistors operably coupled in series between the first array output and the first compare input with the at least two bias signals; and
    limiting the second compare input further comprises:
        generating at least two additional bias signals; and
        biasing at least two additional series-coupled transistors operably coupled in series between second array output and the second compare input with the at least two additional bias signals.

19. The method of claim 17, wherein the first predefined range comprises a range substantially between a first DC bias signal above a common model signal and a second DC bias signal below the common model signal.

20. The method of claim 17, wherein the first predefined range comprises a range substantially between an upper voltage and a lower voltage, the upper voltage comprising a first DC bias signal less an n-channel threshold voltage and the lower voltage comprising a second DC bias signal plus a p-channel threshold voltage.

21. The method of claim 17, wherein the second predefined range comprises a range substantially between a first DC bias signal above a common model signal and a second DC bias signal below the common model signal.

22. The method of claim 17, wherein the second predefined range comprises a range substantially between an upper voltage and a lower voltage, the upper voltage comprising a first DC bias signal less an n-channel threshold voltage and the lower voltage comprising a second DC bias signal plus a p-channel threshold voltage.

* * * * *